United States Patent
Mandai et al.

(10) Patent No.: US 6,525,626 B2
(45) Date of Patent: Feb. 25, 2003

(54) DUPLEXER AND MOBILE COMMUNICATION DEVICE USING THE SAME

(75) Inventors: Harufumi Mandai, Takatsuki (JP); Jun Sasaki, Shiga-ken (JP); Noboru Kato, Moriyama (JP); Sadayuki Matsumura, Takefu (JP); Hiroaki Tsumori, Elk Grove, IL (US)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/867,163

(22) Filed: May 29, 2001

(65) Prior Publication Data

US 2002/0030555 A1 Mar. 14, 2002

(30) Foreign Application Priority Data

May 31, 2000 (JP) ......................... 2000-163172

(51) Int. Cl.⁷ ..................... H01P 1/213; H03H 9/25
(52) U.S. Cl. ..................... 333/134; 333/25; 333/193; 333/133; 333/185
(58) Field of Search ................. 333/133, 193, 333/126, 129, 132, 134, 185, 25

(56) References Cited

U.S. PATENT DOCUMENTS

| | | | | |
|---|---|---|---|---|
| 4,910,481 A | * | 3/1990 | Sasaki et al. | 333/134 |
| 5,561,406 A | * | 10/1996 | Ikata et al. | 333/126 |
| 5,726,610 A | * | 3/1998 | Allen et al. | 333/133 |
| 5,859,473 A | * | 1/1999 | Ikata et al. | 257/723 |
| 5,903,820 A | * | 5/1999 | Hagstrom | 455/82 |
| 6,308,051 B1 | * | 10/2001 | Atokawa | 455/78 |
| 6,373,350 B1 | * | 4/2002 | Fujita | 333/133 |

FOREIGN PATENT DOCUMENTS

| | | | |
|---|---|---|---|
| EP | 0 638 953 | 2/1995 | H01P/1/203 |
| EP | 0 818 883 | 1/1998 | H03H/9/72 |
| EP | 1 067 618 | 1/2001 | H01P/1/203 |
| EP | 1 107 346 | 6/2001 | H01P/1/213 |
| JP | 9-83214 | 3/1997 | H01P/1/213 |
| JP | 11-122139 | * 4/1999 | H04B/1/50 |

* cited by examiner

*Primary Examiner*—Robert Pascal
*Assistant Examiner*—Dean Takaoka
(74) *Attorney, Agent, or Firm*—Keating & Bennett, LLP

(57) ABSTRACT

A duplexer includes a branch circuit connected to an antenna and arranged to branch to a receiving side and a transmitting side, a receiving-side LC parallel resonant-type filter connected to the receiving-side of the branch circuit and arranged to cause a reception signal to be passed and a transmission signal to be attenuated, a surface acoustic wave filter connected to the receiving-side LC parallel resonant-type filter defining a subsequent stage of the receiving-side LC parallel resonant-type filter and arranged to cause the reception signal to be passed and the neighborhood of the high-frequency side of the reception signal to be attenuated, and a transmitting-side LC parallel resonant-type filter connected to the transmitting-side of the branch circuit and arranged to cause the transmission signal to be passed and the reception signal to be attenuated.

18 Claims, 7 Drawing Sheets

DUPLEXER AND MOBILE COMMUNICATION DEVICE USING THE SAME

BACKGROUND OF THE INVENTION

1. Field of the Invention

The present invention relates to high-frequency complex components and mobile communication devices including the same, and more particularly, the present invention relates to a high-frequency complex component obtained by connecting a receiving-side LC parallel resonant-type filter to a surface acoustic wave filter in a cascade arranged and to a mobile communication device including the same.

2. Description of the Related Art

In Japan, a PDC (Personal Digital Cellular) method operating in the 800 MHz band or the 1.5 GHz band is presently adopted in mobile communication devices and corresponding frequency bands are reserved for mobile transmission and station transmission. That is, the transmission band and the reception band of mobile devices are reserved, so that simultaneous transmission and reception are performed using one channel for the transmission band and one channel for the reception band. The interval between the operating channel for transmission and the operating channel for reception is controlled so as to be always constant. At this time, most duplexers, which are used for sharing one antenna for transmission and reception, often have a construction, in which a dielectric filter is used, as proposed in Japanese Unexamined Patent Application Publication No. 9-83214.

FIG. 8 shows a block diagram of a conventional duplexer disclosed in Japanese Unexamined Patent Application Publication No. 9-83214. A duplexer 50 includes a branch circuit 51, a receiving-side dielectric filter 52 having a dielectric coaxial resonator, a surface acoustic wave filter 53, and a transmitting-side dielectric filter 54 having a dielectric coaxial resonator. The branch circuit 51, the receiving-side dielectric filter 52, and the surface acoustic wave filter 53 are connected between a first terminal 501 and a second terminal 502. The branch circuit 51 and the transmitting-side dielectric filter 54 are connected between the first terminal 501 and a third terminal 503. In such a construction, an antenna ANT is connected to the first terminal 501, the second terminal 502 is connected to a reception circuit $R_x$, and the third terminal 503 is connected to a transmission circuit $T_x$.

However, according to the conventional duplexer, use of a dielectric filter causes the duplexer to become large and adjustment of the central frequency becomes difficult. As a result, an increase in the size of a mobile communication device and deterioration of the characteristics thereof become problems.

This is because the length of the dielectric filter is equal to $\lambda/4$, where $\lambda$ is the wavelength of a reception signal or the wavelength of a transmission signal. For example, the length of the filter is 5 cm in the 1.5 GHz band and it is as long as 9.375 cm in the 800 MHz. Although the dielectric element constituting the dielectric filter must be chiseled in order to adjust the central frequency of the dielectric filter, it is very difficult to apply fine adjustment to the dielectric.

SUMMARY OF THE INVENTION

In order to overcome the problems described above, preferred embodiments of the present invention provide a duplexer which is easy to miniaturize and in which the central frequency is easily adjusted, and also provide a mobile communication device including such a novel duplexer.

According to a first preferred embodiment of the present invention, a duplexer preferably includes a branch circuit connected to an antenna and arranged to branch to a receiving side and a transmitting side, a receiving-side LC parallel resonant-type filter connected to the receiving-side of the branch circuit and arranged to cause a reception signal to be passed and a transmission signal to be attenuated, a surface acoustic wave filter connected to the receiving-side LC parallel resonant-type filter defining a subsequent stage of the receiving-side LC parallel resonant type filter and arranged to cause the reception signal to be passed and the area of the high-frequency side of the reception signal to be attenuated, and a transmitting-side LC parallel resonant-type filter connected to the transmitting-side of the branch circuit and arranged to cause the transmission signal to be passed and the reception signal to be attenuated.

Use of an LC parallel resonant-type filter enables the duplexer to be easily adapted to the frequency of the reception signal or the frequency of the transmission signal by changing the values of the inductors and the capacitors without changing the sizes or the appearances of the inductors and the capacitors that constitute the LC parallel resonant-type filter. Therefore, miniaturization of the duplexer is facilitated along with the adjustment of the central frequency.

The branch circuit may include a balun element.

Since a branch circuit preferably includes a balun element, both of a terminal connected to a transmission circuit observed from a terminal connected to a reception circuit and the terminal connected to the reception circuit observed from the terminal connected to the transmission circuit are open in terms of a high frequency. Therefore, since complete isolation is obtained between these terminals, the reception signal is prevented from interfering with the transmission signal side, and vice versa. Consequently, the reliability of the duplexer is improved.

A duplexer may further include a multi-layer substrate defined by a laminated body having a plurality of dielectric layers. In the duplexer, the branch circuit, the receiving side LC parallel resonant-type filter, and the transmitting side LC parallel resonant-type filter may be integrated in the multi-layer substrate and the surface acoustic wave filter may be mounted on the multi-layer substrate.

A multi-layer substrate is preferably formed by laminating a plurality of dielectric layers, the multi-layer substrate which the branch circuit, a receiving-side LC parallel resonant-type filter, and a transmitting-side LC parallel resonant-type filter are integrated therein and a surface acoustic wave filter is mounted thereon. Accordingly, matching adjustment can be easily performed between the branch circuit and the receiving-side LC parallel resonant-type filter, between the receiving-side LC parallel resonant-type filter and the surface acoustic wave filter, and between the branch circuit and the transmitting side LC parallel resonant-type filter. This eliminates the necessity of matching circuits that perform corresponding matching adjustment. Therefore, the duplexer can be further miniaturized. In addition, loss due to wiring between the branch circuit and the receiving-side LC parallel resonant-type filter, between the receiving-side LC parallel resonant-type filter and the surface acoustic wave filter, and between the branch circuit and the transmitting-side LC parallel resonant-type filter can be minimized. Therefore, the overall loss of the duplexer is greatly minimized.

The connection of each of the branch circuit, the receiving-side LC parallel resonant-type filer, the surface acoustic wave filter, and the transmitting-side LC parallel resonant-type filter can be provided and contained within the multi-layer substrate. Therefore, further miniaturization of the duplexer is achieved.

According to a second preferred embodiment of the present invention, a mobile communication device includes a duplexer according to the first preferred embodiment of the present invention.

Since the duplexer which can be easily miniaturized and which can have easily the central frequency adjusted is included, a miniaturized and high-performance mobile communication device can be obtained.

Other features, elements, characteristics and advantages of the present invention will become apparent from the following detailed description of preferred embodiments with reference to the attached drawings.

BRIEF DESCRIPTION OF THE DRAWINGS

FIG. 4H is a bottom view of the seventh dielectric layer;

DETAILED DESCRIPTION OF PREFERRED EMBODIMENTS

Hereinafter, preferred embodiments according to the present invention are described with reference to drawings.

Figure 1:
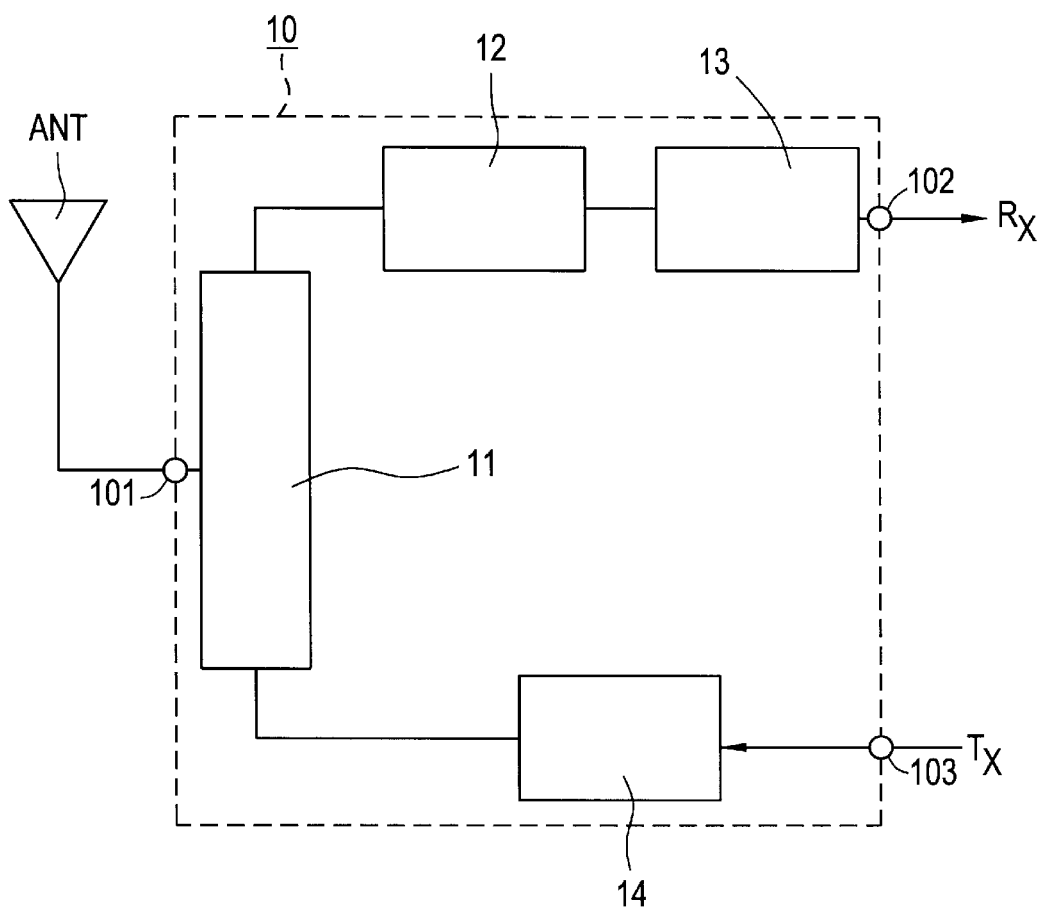
FIG. 1 is a block diagram of a duplexer according to a preferred embodiment of the present invention.

FIG. 1 is a block diagram of a duplexer according to a preferred embodiment of the present invention. A duplexer 10 preferably includes first to third terminals 101 to 103, a branch circuit 11, a receiving-side LC parallel resonant-type filter 12, a surface acoustic wave filter 13, and a transmitting-side LC parallel resonant-type filter 14.

The branch circuit 11, the receiving-side LC parallel resonant-type filter 12, and the surface acoustic wave filter 13 are connected between the first terminal 101 and the second terminal 102. The branch circuit 11 and the transmitting-side LC parallel resonant-type filter 14 are connected between the first terminal 101 and the third terminal 103.

In such a construction, an antenna ANT is connected to the first terminal 101, a reception circuit $R_x$ is connected to the second terminal 102, and a transmission circuit $T_x$ is connected to the third terminal 103.

Figure 2:
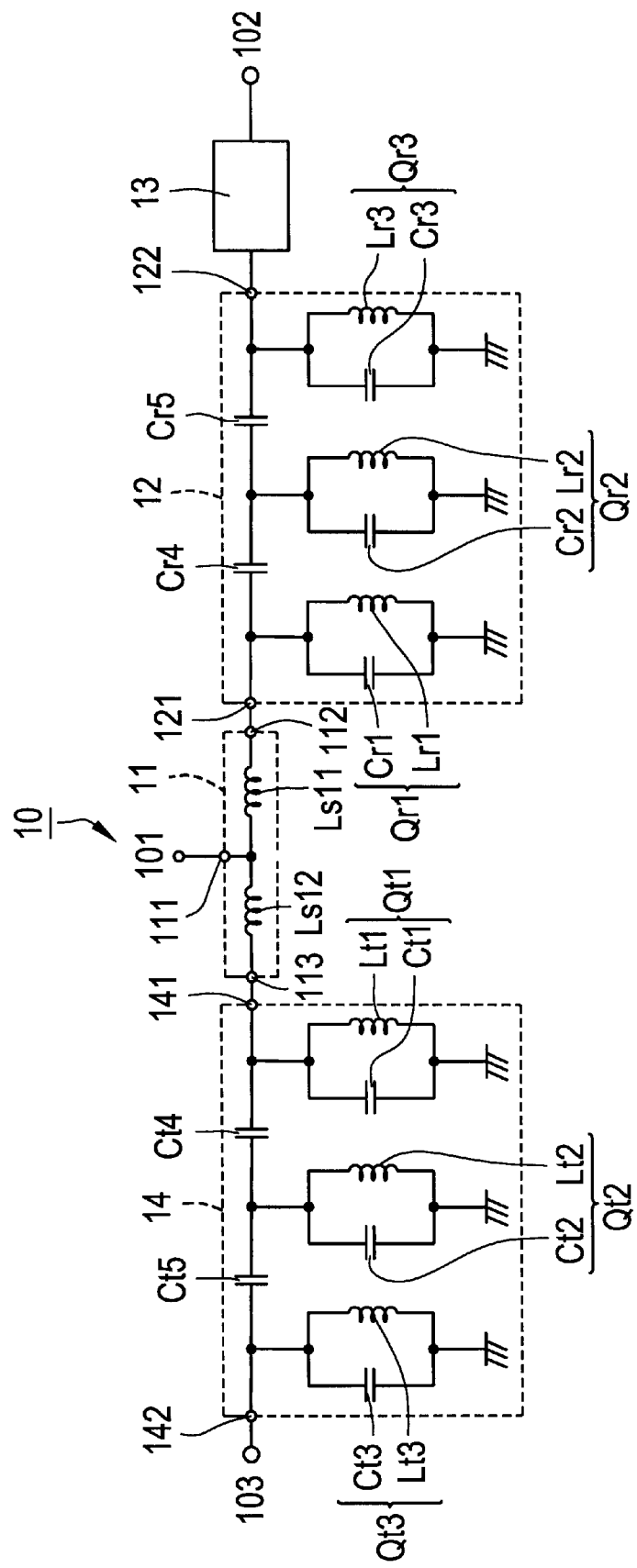
FIG. 2 is an actual circuit diagram of the duplexer shown in FIG. 1.

FIG. 2 is an actual circuit diagram of the duplexer shown in FIG. 1. The branch circuit 11 includes inductors $L_s11$ and $L_s12$. The $L_s11$ is connected between a first terminal 111, which is the first terminal 101 of the duplexer 10, and a second terminal 112, which is connected to the receiving-side LC parallel resonant-type filter 12. The $L_s12$ is connected between the first terminal 111 and a third terminal 113 connected to the transmitting-side LC parallel resonant-type filter 14.

The receiving-side LC parallel resonant-type filter 12 includes inductors $L_r1$ to $L_r3$ and capacitors $C_r1$ to $C_r5$. The inductor $L_r1$ and the capacitor $C_r1$ are connected in parallel to constitute an LC parallel resonator $Q_r1$ the inductor $L_r2$ and the capacitor $C_r2$ are connected in parallel to constitute an LC parallel resonator $Q_r2$, and the inductor $L_r3$ and the capacitor $C_r3$ are connected in parallel to constitute an LC parallel resonator $Q_r3$. The LC parallel resonators $Q_r1$ to $Q_r3$ are connected in a cascade arrangement via inter-stage capacitors $C_r4$ and $C_r5$ between a first terminal 121 connected to the branch circuit 11 and a second terminal 122 connected to the surface acoustic wave filter 13.

The transmitting-side LC parallel resonant-type filter 14 includes inductors $L_t1$ to $L_t3$ and capacitors $C_t1$ to $C_t5$. The inductor $L_t1$ and the capacitor $C_t1$ are connected in parallel to constitute an LC parallel resonator $Q_t1$, the inductor $L_t2$ and the capacitor $C_t2$ are connected in parallel to constitute an LC parallel resonator $Q_t2$, and the inductor $L_t3$ and the capacitor $C_t3$ are connected in parallel to constitute an LC parallel resonator $Q_t3$. The LC parallel resonators $Q_t1$ to $Q_t3$ are connected in a cascade arrangement via inter-stage capacitors $C_t4$ and $C_t5$ between a first terminal 141 connected to the branch circuit 11 and a second terminal 142, which is the third terminal 103 of the duplexer 10.

Figure 3:
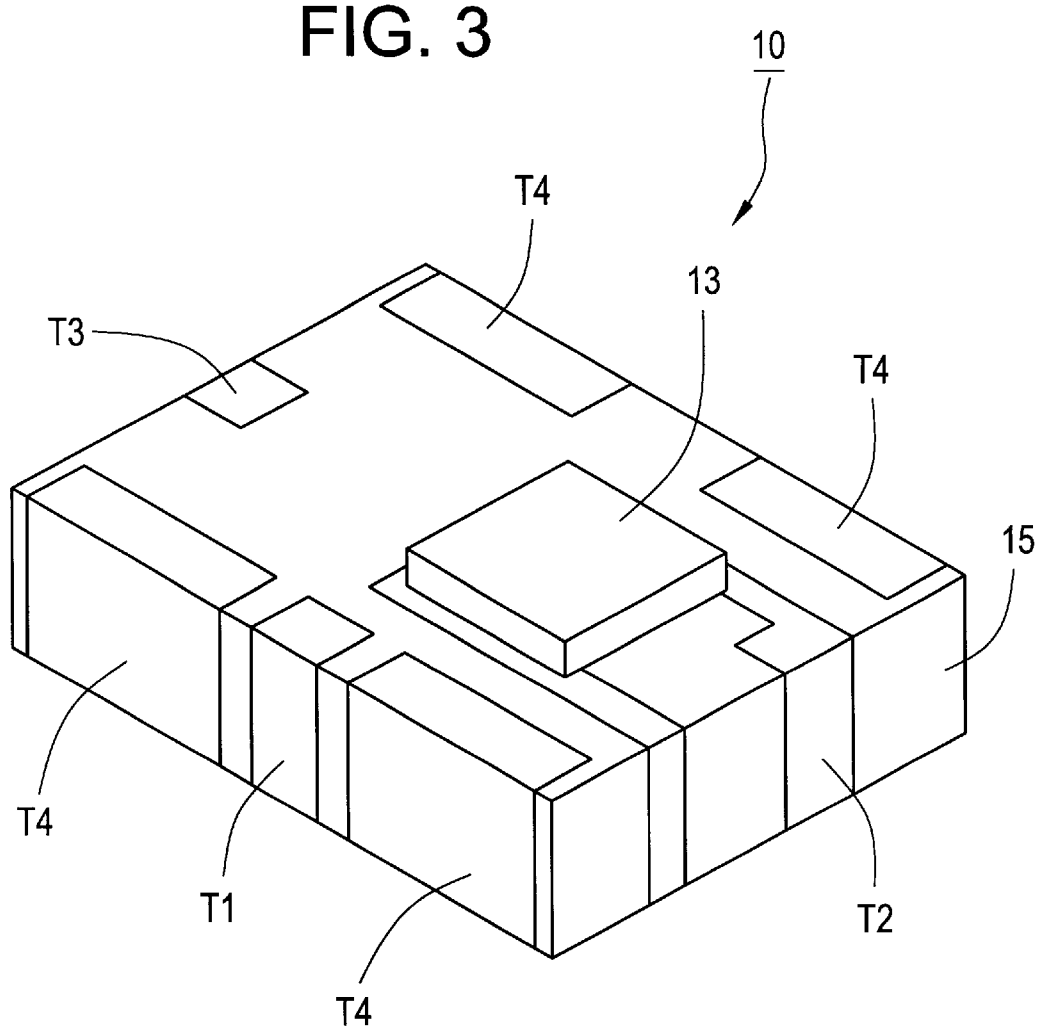
FIG. 3 is a perspective view of the duplexer shown in FIG. 2.
Figure 4:
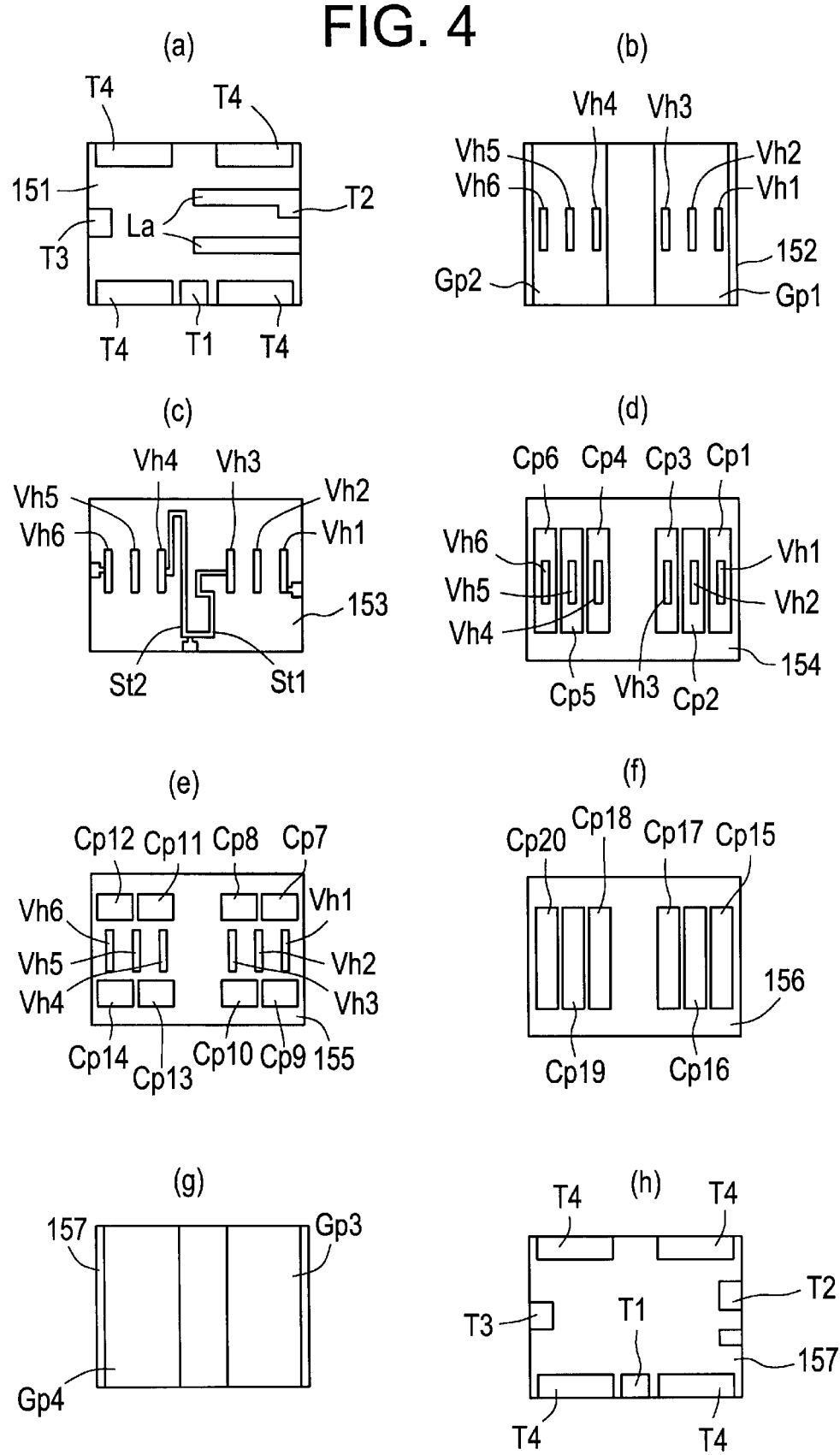
FIGS. 4A to 4H are top views of a first dielectric layer to a seventh dielectric layer, respectively.

FIG. 3 is a perspective view showing an actual construction of the duplexer in FIG. 2. The duplexer 10 preferably includes a multi-layer substrate 15 in which the branch circuit 11 (FIG. 2), the receiving-side LC parallel resonant-type filter 12 (FIG. 2), and the transmitting-side LC parallel resonant-type filter 14 (FIG. 2) are integrated. A bare-chip surface acoustic wave filter 13 is preferably mounted on the multi-layer substrate 15.

External terminals T1 to T4 are disposed on side surfaces from the top surface to the bottom surface of the multi-layer substrate 15 in which the external terminals T1 to T3 define the first terminal 101 to the third terminal 103, respectively, of the duplexer 10 and the external terminal T4 defines a ground terminal.

FIGS. 4A to 4G are top views of the dielectric layers constituting the multi-layer substrate of the duplexer in FIG. 3. FIG. 4H is a bottom view of the layer shown in FIG. 4G. The multi-layer substrate 15 is preferably formed by sequentially laminating, from the top, first to seventh dielectric layers 151 to 157 each including ceramic having a relative dielectric constant of approximately 6 and being made of main components including barium oxide, aluminum oxide, and silica, and then by firing them at a firing temperature of about 1000° C. or below.

Land $L_a$ for mounting the surface acoustic wave filter 13 thereon and external terminals T1 to T4 are provided on the top surface of the first dielectric layer 151. Ground electrodes $G_p1$ and $G_p2$ are provided on the top surface of the second dielectric layer 152.

Strip line electrodes ST1 and ST2 are disposed on the top surface of the third dielectric layer 153. Capacitor electrodes $C_p1$ to $C_p6$ are provided on the top surface of the fourth dielectric layer 154.

Capacitor electrodes $C_p7$ to $C_p14$ are disposed on the top surface of the fifth dielectric layer 155. Capacitor electrodes $C_p15$ to $C_p20$ are provided on the top surface of the sixth dielectric layer 156.

Ground electrodes $G_p3$ and $G_p4$ are disposed on the top surface of the seventh dielectric layer 157. The external terminals T1 to T4 are disposed on the bottom surface of the seventh dielectric layer 157 (indicated by reference numeral 157u in FIG. 4H). Via-hole electrodes $V_h1$ to $V_h6$ are provided on the second dielectric layer 152 to the fifth dielectric layer 155 so as to go through the dielectric layers 152 to 155.

The first to seventh dielectric layers 151 to 157 are preferably obtained by mixing, along with a binding agent and other suitable material, dielectric ceramic having main components including barium oxide, aluminum oxide, and silica and which can be fired at, for example, a temperature between about 850° C. and about 1000° C., and forming this mixed material into sheets.

The strip line electrodes ST1 and ST2, the capacitor electrodes $C_p1$ to $C_p20$, the ground electrodes $G_p1$ to $G_p4$, the land $L_a$, and the external terminal T1 to T4 which include Ag, Pd, Ag—Pd, Cu, and other elements are correspondingly formed on the top surfaces or bottom surfaces of the first to seventh dielectric layers 151 to 157 by printing, sputtering, vacuum deposition or other suitable method.

The multi-layer substrate 15 is preferably obtained by laminating the first to seventh dielectric layers 151 to 157 and integrally firing them. The via-hole electrodes $V_h1$ to $V_h6$ provided inside the multi-layer substrate 15 each establish connections among the strip line electrodes ST1 and ST2, the capacitor electrodes $C_p1$ to $C_p20$, and the ground electrodes $G_p1$ and $G_p2$.

In the duplexer 10 having the above-described unique construction, the inductors $L_s11$ and $L_s12$ (FIG. 1) of the resonant circuit 11 are defined by the strip line electrodes ST11 and ST12.

Inductors $L_r1$ to $L_r3$ of the receiving-side LC parallel resonant-type filter 12 preferably include the via-hole electrodes $V_h3$ to $V_h1$, respectively.

The capacitor $C_r1$ of the receiving-side LC parallel resonant-type filter 12 is preferably defined by the capacitor electrode $C_p17$ and the ground electrode $G_p3$, the capacitor $C_r2$ preferably includes the capacitor electrode $C_p16$ and the ground electrode $G_p3$, the capacitor $C_r3$ is preferably defined by the capacitor electrode $C_p15$ and the ground electrode $G_p3$, the capacitor $C_r4$ preferably includes the capacitor electrodes $C_p3$, $C_p2$, $C_p8$, $C_p10$, $C_p17$, and $C_p16$, and the capacitor $C_r5$ preferably includes the capacitor electrodes $C_p2$, $C_p1$, $C_p7$, $C_p9$, $C_p16$, and $C_p15$.

Similarly, the inductors $L_t1$ to $L_t3$ of the transmitting-side LC parallel resonant-type filter 14 are defined by the via-hole electrodes $V_h4$ to $V_h6$, respectively.

In addition, the capacitor $C_t1$ of the transmitting-side LC parallel resonant-type filter 14 is defined by the capacitor electrode $C_p18$ and the ground electrode $G_p4$, the capacitor $C_t2$ is defined by the capacitor electrode $C_p19$ and the ground electrode $G_p4$, the capacitor $C_t3$ is defined by the capacitor electrode $C_p20$ and the ground electrode $G_p4$, the capacitor $C_t4$ preferably includes the capacitor electrodes $C_p4$, $C_p5$, $C_p11$, $C_p13$, $C_p18$, and $C_p19$, and the capacitor $C_t5$ preferably includes the capacitor electrodes $C_p5$, $C_p6$, $C_p12$, $C_p14$, $C_p19$, and $C_p20$.

Figure 5:
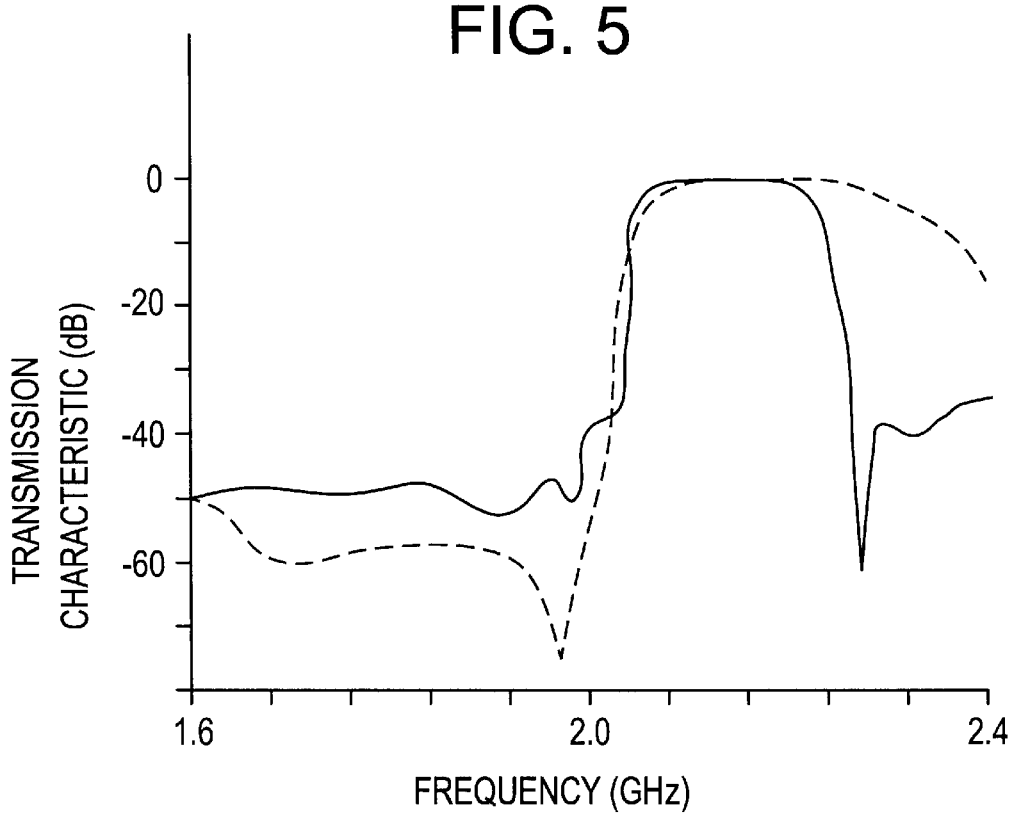
FIG. 5 is a graph showing a transmission characteristic of the duplexer shown in FIGS. 4A to 4H.

FIG. 5 is a graph showing the transmission characteristic of the duplexer in FIGS. 4A to 4H. This transmission characteristic was measured between the first terminal 101 to be connected to the antenna ANT and the second terminal 102 to be connected to the reception circuit $R_x$. For comparison, a case is also shown in which the surface acoustic wave filter (dashed line) is not provided.

This drawing demonstrates that an attenuation pole of the receiving-side LC parallel resonant-type filter 12 is generated at around 1.98 GHz and a gain of −30 (dB) or below can be obtained at about 2.03 GHz or below and that an attenuation pole of the surface acoustic wave filter 13 is generated at around 2.28 GHz and a gain of at −30 (dB) or below can be obtained at about 2.26 GHz or more. That is, it is understood that the receiving-side LC parallel resonant-type filter 14 can attenuate a signal having approximately the transmission frequency and the surface acoustic wave filter 13 can attenuate around a high-frequency side of the reception signal.

Figure 6:
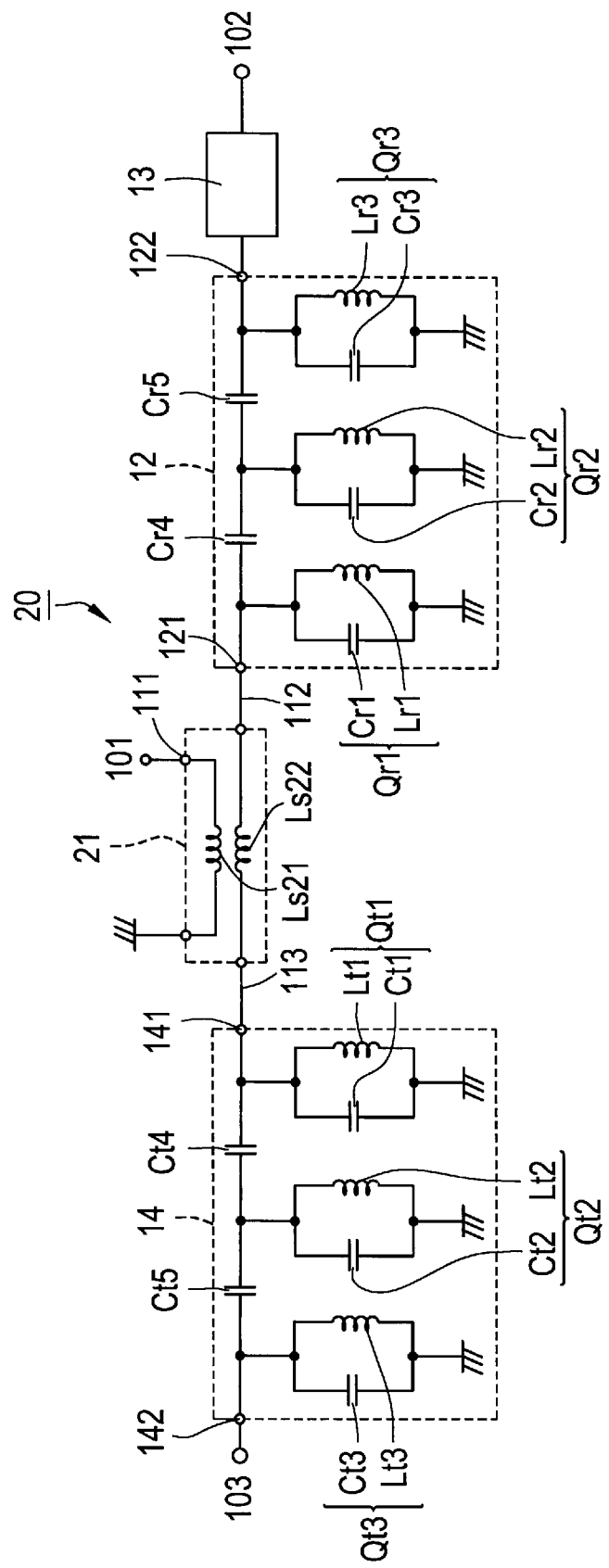
FIG. 6 is another actual circuit diagram of the duplexer shown in FIG. 1.

FIG. 6 is another actual circuit diagram of the duplexer shown in FIG. 1. A duplexer 20 differs from the actual circuit in FIG. 2 in that the branch circuit 21 includes a balun element including inductors $L_s21$ and $L_s22$.

One end of the inductor $L_s21$ is connected to the first terminal 101 of the duplexer 20 and the other end thereof is grounded. One end of the inductor $L_s21$ is connected to the receiving-side LC parallel resonant-type filter 12 and the other end thereof is connected to the transmitting-side LC parallel resonant-type filter 14.

According to the duplexer of the above-described preferred embodiment, use of the LC parallel resonant-type filter enables the duplexer to easily adapt to the reception signal frequency or the transmission signal frequency, without changing the sizes of appearances of inductors and capacitors which constitute the LC parallel resonant-type filter, by changing the values of inductors or capacitors. Therefore, miniaturization and adjustment of the central frequency are facilitated. The outer dimensions of the duplexer in FIGS. 4A to 4H are, for example, approximately 9.4 mm×3.0 mm×2.0 mm.

The duplexer preferably includes the multi-layer substrate formed by laminating a plurality of dielectric layers. The branch circuit, the receiving-side LC parallel resonant-type filter, and the transmitting-side LC parallel resonant-type filter are integrated in the multi-layer substrate and the surface acoustic wave filter is mounted on the multi-layer substrate. Accordingly, matching adjustment is facilitated between the branch circuit and the receiving-side LC parallel resonant-type filter, between the receiving-side LC parallel resonant-type filter and the surface acoustic wave filter, and between the branch circuit and the transmitting-side LC parallel resonant-type filter, which eliminates necessities of the corresponding matching circuits for performing matching adjustment. Therefore, the duplexer is further miniaturized. In addition, wiring loss can be each improved between the branch circuit and the receiving-side LC parallel resonant-type filter, between the receiving-side LC parallel resonant-type filter and the surface acoustic wave filter, and between the branch circuit and the transmitting-side LC parallel resonant-type filter. Accordingly, the overall loss of the duplexer is greatly minimized.

Furthermore, the connection of each of the branch circuit, the receiving-side LC parallel resonant-type filter, the surface acoustic wave filter, and the transmitting-side LC parallel resonant-type filter can be provided in the multi-layer substrate. Therefore, furthermore miniaturization of the duplexer is achieved.

As in the duplexer in FIG. 6, when the branch circuit is constructed using the balun element, both of the third terminal connected to the transmission circuit observed from the second terminal connected to the reception circuit and the second terminal observed from the third terminal are open in terms of a high frequency. Therefore, since complete isolation can be obtained between the second terminal and the third terminal, the reception signal is prevented from interfering with the transmission signal side, and vice versa. Consequently, the reliability of the duplexer is greatly improved.

Figure 7:
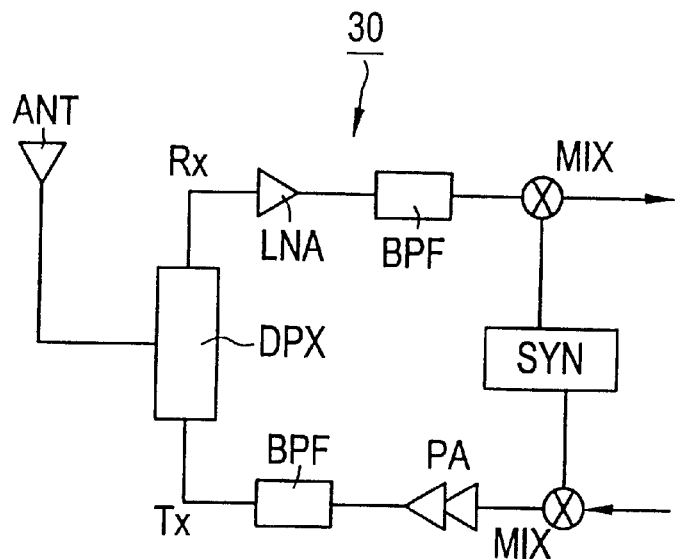
FIG. 7 is a block diagram showing an RF unit of a portable telephone, which is a common mobile communication device.
Figure 8:
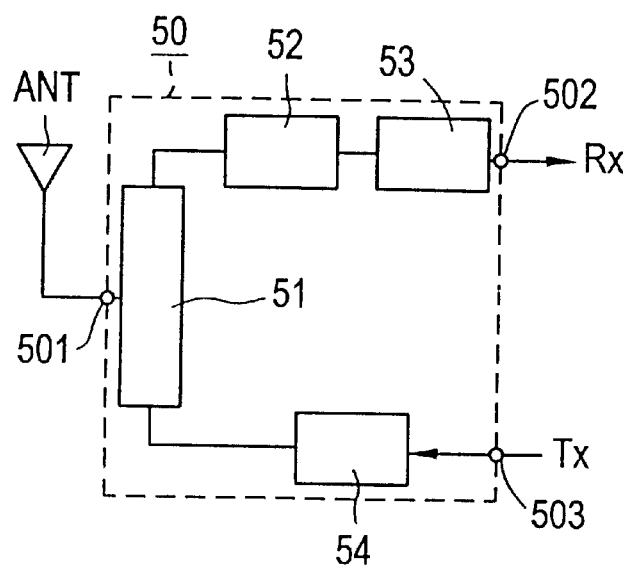
FIG. 8 is a block diagram showing a conventional duplexer.

FIG. 7 is a block diagram showing an RF unit of a portable telephone, which is a common mobile communication device. The portable telephone includes the antenna ANT, a duplexer DPX, the reception circuit $R_x$, and the transmission circuit $T_x$.

The reception circuit $R_x$ includes a low-noise amplifier LNA, a band-pass filter BPF, and a mixer MIX. The transmission circuit includes a band-pass filter BPF, a high-powered amplifier PA, and a mixer MIX. One input of each of the mixer MIX of the reception circuit $R_x$ and the mixer MIX of the transmission circuit $T_x$ is connected to a synthesizer SYN generating a local oscillating signal.

At this time, the duplexer 10 shown in FIG. 2 or the duplexer 20 shown in FIG. 6 is used in the duplexer DPX constituting the RF unit 30 of the portable telephone.

According to the portable telephone the present preferred embodiment, since the duplexer in which adjustment of the central frequency is facilitated while miniaturization is facilitated is used, the miniaturized and high-performance portable telephone is realized.

In the duplexer according to various preferred embodiments of the present invention described above, the case is described in which the surface acoustic wave filter is mounted on the multi-layer substrate having the branch circuit, the receiving-side LC parallel resonant-type filter, and the transmitting-side LC parallel resonant-type filter integrated therein. Alternatively, the multi-layer substrate having the branch circuit, the receiving-side LC parallel resonant-type filter, and the transmitting-side LC parallel resonant-type filter integrated therein and the surface acoustic wave filter may be constructed so as to be implemented on a print-circuit board.

The upper portion of the surface acoustic wave filter may be coated with resin, a metal casing, or other suitable material.

While the present invention has been described with reference to what is presently considered to be the preferred embodiment, it is to be understood that the invention is not limited to the disclosed preferred embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A duplexer comprising:
   a branch circuit connected to an antenna and arranged to branch to a receiving side and a transmitting side;
   a receiving-side LC parallel resonant filter connected to the receiving-side of said branch circuit and arranged to cause a reception signal to be passed and a transmission signal to be attenuated;
   a surface acoustic wave filter connected to said receiving-side LC parallel resonant filter defining a subsequent stage of said receiving-side LC parallel resonant filter and arranged to cause the reception signal to be passed and the area near the high-frequency side of the reception signal to be attenuated; and
   a transmitting-side LC parallel resonant filter connected to the transmitting-side of said branch circuit and arranged to cause the transmission signal to be passed and the reception signal to be attenuated; wherein said branch circuit includes a balun element.

2. A duplexer according to claim 1, wherein said branch circuit further comprises at least two inductors.

3. A duplexer according to claim 1, further comprising a multi-layer substrate including a laminated body having a plurality of dielectric layers, wherein said branch circuit, said receiving-side LC parallel resonant-type filter, and said transmitting-side LC parallel resonant filter are integrated in said multi-layer substrate, and said surface acoustic wave filter is mounted on said multi-layer substrate.

4. A duplexer according to claim 3, further comprising external terminals disposed on side surfaces from the top surface to the bottom surface of the multi-layer substrate.

5. A mobile communication device comprising a duplexer according to claim 1.

6. A mobile communication device according to claim 5, further comprising a multi-layer substrate including a laminated body having a plurality of dielectric layers, wherein said branch circuit, said receiving-side LC parallel resonant filter, and said transmitting-side LC parallel resonant filter are integrated in said multi-layer substrate, and said surface acoustic wave filter is mounted on said multi-layer substrate.

7. A duplexer comprising:
   a branch circuit connected to an antenna and arranged to branch to a receiving side and a transmitting side;
   a receiving-side LC parallel resonant filter connected to the receiving-side of said branch circuit and arranged to cause a reception signal to be passed and a transmission signal to be attenuated;
   a surface acoustic wave filter connected to said receiving-side LC parallel resonant filter defining a subsequent stage of said receiving-side LC parallel resonant filter and arranged to cause the reception signal to be passed and the area near the high-frequency side of the reception signal to be attenuated;
   a transmitting-side LC parallel resonant filter connected to the transmitting-side of said branch circuit and arranged to cause the transmission signal to be passed and the reception signal to be attenuated; and
   first, second and third terminals, wherein
      the receiving-side LC parallel resonant filter and the surface acoustic wave filter are connected between the first terminal and the second terminal, and the branch circuit and the transmitting-side LC parallel resonant filter are connected between the first terminal and the third terminal.

8. A duplexer according to claim 7, wherein the second terminal is connected to a reception circuit.

9. A duplexer according to claim 7, wherein the third terminal is connected to a transmission circuit.

10. A duplexer according to claim 7, wherein said branch circuit includes at least two inductors.

11. A duplexer according to claim 10, wherein one of the at least two inductors is connected between the first terminal and the second terminal which is connected to the receiving-side LC parallel resonant filter, and the other of the at least two inductors is connected between the first terminal and the third terminal which is connected to the transmitting-side LC parallel resonant filter.

12. A duplexer according to claim 7, wherein the first terminal is connected to the antenna.

13. A duplexer comprising:

a branch circuit connected to an antenna and arranged to branch to a receiving side and a transmitting side;

a receiving-side LC parallel resonant filter connected to the receiving-side of said branch circuit and arranged to cause a reception signal to be passed and a transmission signal to be attenuated;

a surface acoustic wave filter connected to said receiving-side LC parallel resonant filter defining a subsequent stage of said receiving-side LC parallel resonant filter and arranged to cause the reception signal to be passed and the area near the high-frequency side of the reception signal to be attenuated; and a transmitting-side LC parallel resonant filter connected to the transmitting-side of said branch circuit and arranged to cause the transmission signal to be passed and the reception signal to be attenuated; wherein
said receiving-side LC parallel resonant filter includes a plurality of inductors and a plurality of capacitors.

14. A duplexer according to claim 13, further comprising first, second and third terminals, wherein a first of the plurality of inductors and a first of the plurality of capacitors are connected in parallel to define a first LC parallel resonator, a second of the plurality of inductors and a second of the plurality of capacitors are connected in parallel to constitute a second LC parallel resonator, and a third of the plurality of inductors and a third of the plurality of capacitors are connected in parallel to constitute a third LC parallel resonator.

15. A duplexer according to claim 14, wherein the first, second and third LC parallel resonators are connected to each other in a cascade arrangement between the first terminal connected to the branch circuit and the second terminal connected to the surface acoustic wave filter.

16. A duplexer comprising:

a branch circuit connected to an antenna and arranged to branch to a receiving side and a transmitting side;

a receiving-side LC parallel resonant filter connected to the receiving-side of said branch circuit and arranged to cause a reception signal to be passed and a transmission signal to be attenuated;

a surface acoustic wave filter connected to said receiving-side LC parallel resonant filter defining a subsequent stage of said receiving-side LC parallel resonant filter and arranged to cause the reception signal to be passed and the area near the high-frequency side of the reception signal to be attenuated; and a transmitting-side LC parallel resonant filter connected to the transmitting-side of said branch circuit and arranged to cause the transmission signal to be passed and the reception signal to be attenuated; wherein
said transmitting-side LC parallel resonant filter includes a plurality of inductors and a plurality of capacitors.

17. A duplexer according to claim 16, further comprising first, second and third terminals, wherein a first of the plurality of inductors and a first of the plurality of capacitors are connected in parallel to define a first LC parallel resonator, a second of the plurality of inductors and a second of the plurality of capacitors are connected in parallel to constitute a second LC parallel resonator, and a third of the plurality of inductors and a third of the plurality of capacitors are connected in parallel to constitute a third LC parallel resonator.

18. A duplexer according to claim 17, wherein the first, second and third LC parallel resonators are connected to each other in a cascade arrangement between the first terminal connected to the branch circuit and the third terminal.

* * * * *